United States Patent
Tansu et al.

(10) Patent No.: US 10,115,859 B2
(45) Date of Patent: Oct. 30, 2018

(54) NITRIDE BASED DEVICES INCLUDING A SYMMETRICAL QUANTUM WELL ACTIVE LAYER HAVING A CENTRAL LOW BANDGAP DELTA-LAYER

(75) Inventors: Nelson Tansu, Bethlehem, PA (US); Hongping Zhao, Bethlehem, PA (US); Guangyu Liu, Bethlehem, PA (US); Gensheng Huang, Bethlehem, PA (US)

(73) Assignee: Lehigh University, Bethleham, PA (US)

(*) Notice: Subject to any disclaimer, the term of this patent is extended or adjusted under 35 U.S.C. 154(b) by 207 days.

(21) Appl. No.: 12/968,960

(22) Filed: Dec. 15, 2010

(65) Prior Publication Data

US 2011/0204328 A1 Aug. 25, 2011

Related U.S. Application Data (60) Provisional application No. 61/286,602, filed on Dec. 15, 2009.

(51) Int. Cl.
*H01L 29/06* (2006.01)
*H01L 31/00* (2006.01)
(Continued)

(52) U.S. Cl.
CPC .............. *H01L 33/06* (2013.01); *H01L 33/32* (2013.01)

(58) Field of Classification Search
CPC . H01L 2924/10334; H01L 2924/10346; H01L 33/06; H01L 33/32; H01L 33/007;
(Continued)

(56) References Cited

U.S. PATENT DOCUMENTS 6,455,870 B1    9/2002  Wang et al.
6,504,171 B1 *  1/2003  Grillot et al. .................. 257/14
(Continued)

FOREIGN PATENT DOCUMENTS

WO    2005/067468 A2    7/2005
WO    2007/138658 A1   12/2007
WO    2009/033448 A2    3/2009

OTHER PUBLICATIONS

Yuki et al "1-2 ML thick InN-based quantum wells with InGaN barriers for blue-green light emitters", Phys. Status Solidi C 6, No. S2, S417-S420 (2009) / DOI 10.1002/pssc.200880969.*
(Continued)

*Primary Examiner* — Duy T Nguyen
(74) *Attorney, Agent, or Firm* — FisherBroyles LLP (57) ABSTRACT

A symmetrical quantum well active layer provides enhanced internal quantum efficiency. The quantum well active layer includes an inner (central) layer and a pair of outer layers sandwiching the inner layer. The inner and outer layers have different thicknesses and bandgap characteristics. The outer layers are relatively thick and include a relatively low bandgap material, such as InGaN. The inner layer has a relatively lower bandgap material and is sufficiently thin to act as a quantum well delta layer, e.g., comprising approximately 6 Å or less of InN. Such a quantum well structure advantageously extends the emission wavelength into the yellow/red spectral regime, and enhances spontaneous emission. The multi-layer quantum well active layer is sandwiched by barrier layers of high bandgap materials, such as GaN.

23 Claims, 5 Drawing Sheets

(51) Int. Cl.
*H01L 33/06* (2010.01)
*H01L 33/32* (2010.01)

(58) Field of Classification Search
CPC ..... H01L 21/02458; H01L 2924/12041; H01L 29/2003; H01L 29/127; H01L 33/0025
USPC .......................................................... 257/14
See application file for complete search history.

(56) References Cited

U.S. PATENT DOCUMENTS

| | | | |
|---|---|---|---|
| 6,844,084 B2 | 1/2005 | Kokta et al. | |
| 6,856,005 B2* | 2/2005 | Yoshikawa et al. | 257/615 |
| 6,881,983 B2 | 4/2005 | Narayan et al. | |
| 6,977,952 B2 | 12/2005 | Yamaguchi et al. | |
| 6,996,150 B1 | 2/2006 | Shakuda | |
| 7,002,180 B2 | 2/2006 | Oh et al. | |
| 7,034,328 B2 | 4/2006 | Doverspike et al. | |
| 7,037,742 B2 | 5/2006 | Slater, Jr. et al. | |
| 7,071,490 B2 | 7/2006 | Edmond et al. | |
| 7,166,869 B2 | 1/2007 | Nakamura et al. | |
| 7,282,745 B2 | 10/2007 | Yamaguchi et al. | |
| 7,616,672 B2 | 11/2009 | Shakuda | |
| 7,842,531 B2 | 11/2010 | Tansu et al. | |
| 2002/0096675 A1* | 7/2002 | Cho et al. | 257/25 |
| 2006/0054897 A1* | 3/2006 | Yu et al. | 257/79 |
| 2006/0128122 A1* | 6/2006 | Bousquet | C30B 23/02 438/478 |
| 2006/0244002 A1 | 11/2006 | Hooper et al. | |
| 2007/0262293 A1 | 11/2007 | Fujikura | |
| 2007/0272915 A1* | 11/2007 | Nakamura | B82Y 20/00 257/14 |
| 2008/0142779 A1 | 6/2008 | Yang | |
| 2008/0237570 A1* | 10/2008 | Choi | B82Y 20/00 257/13 |
| 2008/0290355 A1 | 11/2008 | Naum et al. | |
| 2009/0242897 A1 | 10/2009 | Bergmann et al. | |

OTHER PUBLICATIONS

International Search Report, dated Apr. 6, 2011, and Written Opinion issued in corresponding International Application No. PCT/US10/60501.
Zhao et al., Appl. Physics Lett. 97, 131114 (2010).
Zhao et al., J. Applied Physics 107, 113110 (2010).
Zhao et al., J. Selected Topics in Quantum Electronics, vol. 15, No. 4, pp. 1104-1114 (Aug. 2009).
Arif et al., Applied Physics Letts 91, 091110 (2007).
Arif et al., IEEE J. Quantum Electronics, vol. 44, No. 6, pp. 573-580 (Jun. 2008).
Zhao et al., Applied Physics Lett 95, 061104 (2009).
Zhao et al., IET Optoelectron., vol. 3, iss 6, pp. 283-295 (2009).
Park et al., Appl. Phys. Lett. 88, 202107 (2006).
Park et al., Appl. Phys. Lett. 90, 023508 (2007).

* cited by examiner

NITRIDE BASED DEVICES INCLUDING A SYMMETRICAL QUANTUM WELL ACTIVE LAYER HAVING A CENTRAL LOW BANDGAP DELTA-LAYER

CROSS-REFERENCE TO RELATED APPLICATIONS

This application claims the benefit of priority under 35 U.S.C. § 119(e) of U.S. Provisional Patent Application Nos. 61/286,602, filed Dec. 15, 2009, the entire disclosure of which is hereby incorporated herein by reference.

STATEMENT OF GOVERNMENT INTEREST

This invention was made with government support under U.S. National Science Foundation—ECCS Award #0701421, and US Department of Energy—NETL (DE-FC26-08NT01581). The government has certain rights in the invention.

FIELD OF THE INVENTION

The present invention relates generally to semiconductor light-emitting devices (LEDs) including gallium-nitride (GaN)-based quantum wells, and more particularly to a semiconductor LED having an enhanced internal quantum efficiency.

DISCUSSION OF RELATED ART

A quantum well is a potential boundary that confines particles to a planar, substantially two dimension region. As used herein, the term "quantum well" refers to a thin-layer structure comprising alternate layers consisting of a first semiconductor layer with a thickness smaller than the de Broglie wavelength of about 200 Å to 300 Å with respect to electrons or holes and at least a second semiconductor layer with a bandgap greater than that of the first semiconductor layer. A "substrate" is an underlying template or substratum can such as a sapphire template, an Si substrate, SiC substrate or ZnO substrate.

The electrons and holes in the quantum well layer cannot move freely in the direction of thickness and are substantially confined two-dimensionally in a plane perpendicular to the thickness direction. The two-dimensional confinement increases bound energy of Coulombic electron, and hole attraction so that excitons occur under heat energy at room temperature.

Figure 1:
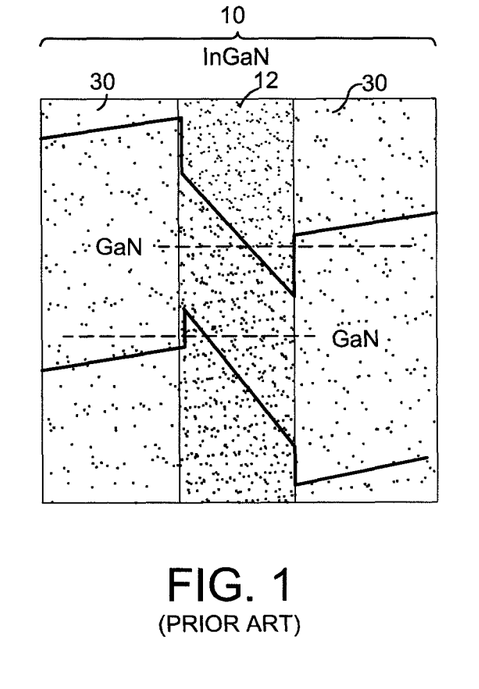
FIG. 1 is a diagrammatic representation of an exemplary prior art semiconductor LED's gallium-nitride-based quantum well that includes an InGaN layer sandwiched between higher bandgap layers of GaN.

A quantum well can be formed as part of a semiconductor by having a material, such as indium gallium nitride (In-GaN), sandwiched between two layers of a larger bandgap material such as gallium nitride (GaN). FIG. 1 is a diagrammatic representation of an exemplary prior art gallium-nitride-based quantum well 10 that includes an active layer 12 of InGaN sandwiched between higher bandgap barrier layers 30 of GaN. For example, the InGaN active layer 12 may have a thickness of approximately 20 Å to 50 Å, and each barrier layer 30 may have a thickness of approximately 50 Å to 250 Å.

A quantum well effect can be achieved in a device by alternating tens to hundreds of two kinds of very thin semiconductor layers with different bandgap characteristics. As well known in the art, such structures can be grown by molecular beam epitaxy (MBE) and chemical vapor deposition (MO-CVD). These procedures can provide a layer having a thickness as small as a molecular monolayer.

Because of a quasi-two dimensional nature, electrons in a quantum well have a sharper density of state than bulk materials. As a result, quantum well structures are in wide use in diode lasers. They are also used to make HEMTs (High Electron Mobility Transistors), which are used in low-noise electronics.

Quantum well-based emitters (LEDs and diode lasers) in the blue, green, and red regime are important for solid state lighting, display and medical applications. These applications require highly efficient blue, green, and red diodes integrated in a single semiconductor chip. However, only low efficiency can be attained with typical gallium nitride-based quantum wells, such as InGaN-based quantum wells, particularly as emission wavelength is extended beyond green spectral regime and into the yellow and red spectral regimes.

Figure 2:
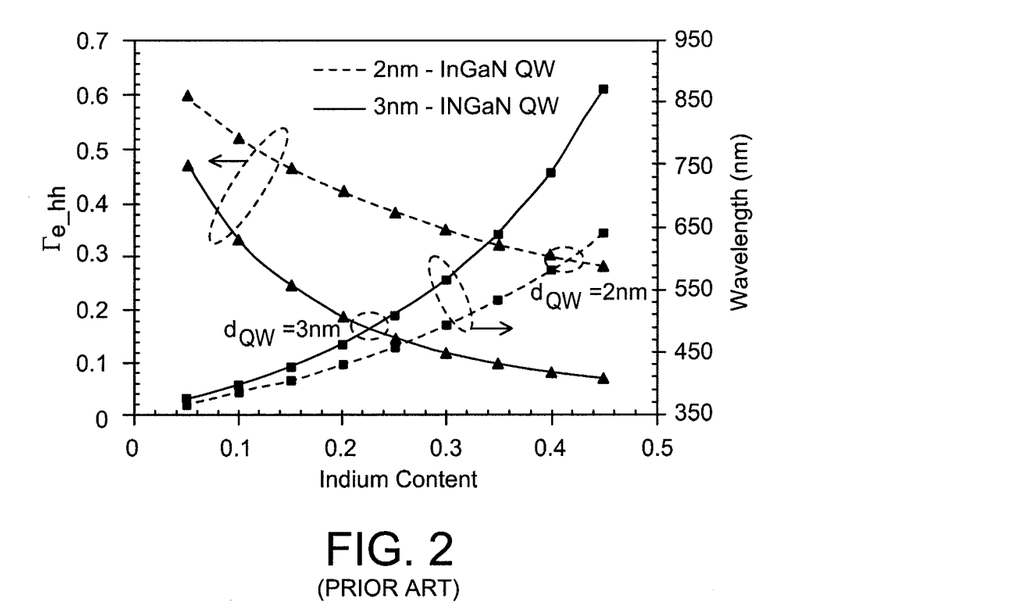
FIG. 2 is a graph showing electron-hole wave function overlap and peak emission wavelength vs. indium content for exemplary prior art InGaN quantum wells.

The GaN-based quantum well semiconductor suffers from large charge separation in the quantum well. Due to the polarization fields in an InGaN quantum well, the electron and hole wavefunctions are confined in opposite directions leading to reduction of the electron-hole wavefunction overlap ($\Gamma_{e\_hh}$), as shown in FIG. 2. The detrimental effect from such charge separation becomes more severe, as the emission wavelength of the InGaN quantum wells is extended into green, yellow and red spectral regimes. Approaches proposed to address the charge separation in InGaN quantum wells has included use of a non-polar InGaN quantum well, an InGaN quantum well with a high-bandgap central AlGaN delta-layer (AlGaN having a higher bandgap characteristic than the bandgap of the InGaN active layer and the bandgap of the GaN barrier layer, a staggered InGaN quantum well including multiple different InGaN layers, a type-II InGaN-based quantum well including both an electron well InGaN layer and a hole well GaNAs layer, and a strain-compensated InGaN quantum well including tensile strained AlGaN barrier layers.

The use of staggered InGaN quantum well led to improved overlap $\Gamma_{e\_hh}$ in comparison to that of conventional quantum well. Despite its larger overlap $\Gamma_{e\_hh}$ over a conventional quantum well ($\Gamma_{e\_hh}$=37% for $\lambda$~420 nm; $\Gamma_{e\_hh}$=30% for $\lambda$~440 nm; $\Gamma_{e\_hh}$=17% for $\lambda$~500 nm; $\Gamma_{e\_hh}$=9% for $\lambda$~540 nm), the optimized overlap $\Gamma_{e\_hh}$ for a staggered InGaN quantum well decreases ($\Gamma_{e\_hh}$=68% for $\lambda$~420 nm; $\Gamma_{e\_hh}$=48% for $\lambda$~440 nm; $\Gamma_{e\_hh}$=32% for $\lambda$~500 nm; $\Gamma_{e\_hh}$=21% for $\lambda$~540 nm) as its emission wavelength extends to the longer yellow and red spectral regimes.

As shown in FIG. 2, red-shifting the emission wavelength in InGaN quantum wells is challenging. FIG. 2 plots the $\Gamma_{e\_hh}$ [left] and peak emission wavelength [right] as a function of the indium (In) content for InGaN quantum well with quantum well thicknesses ($d_{qw}$) of $d_{qw}$=2 nm and $d_{qw}$=3 nm. As can be seen from FIG. 2, the In-content increases from 5% to 45%, the overlap $\Gamma_{e\_hh}$ decreases dramatically from 60% (47%) to 27.8% (6.8%) while the emission wavelength increases from 372 nm (377 nm) to 640 nm (871 nm) for the InGaN quantum well with $d_{qw}$=2 nm ($d_{qw}$=3 nm). Similarly, when the quantum well thickness ($d_{qw}$) increases, the emission wavelength extends longer while the overlap $\Gamma_{e\_hh}$ decreases significantly.

There remains a continued need for enhanced quantum efficiency in gallium nitride based quantum well light-emitting devices, particularly for use in the yellow and red spectral regimes.

SUMMARY

The present invention provides a symmetrical quantum well active layer, and a gallium-nitride based semiconductor device including a symmetrical quantum well active layer, that provides enhanced internal quantum efficiency. The symmetrical quantum well active layer includes an inner layer of a first nitride-based material, and a pair of outer layers sandwiching the inner layer. The first nitride-based material has a first bandgap characteristic, and the second nitride-based material has a second bandgap characteristic greater than the first bandgap characteristic. The inner and outer layers have different thicknesses.

In one embodiment, the inner layer of the active region is relatively thin and each of the outer layers of the active region is relatively thick. In such an embodiment, the outer layers comprise InGaN, and the inner layer comprises InN. In such an embodiment, the inner layer acts as a delta-layer, and has a thickness measuring approximately 6 Å or less, and preferably approximately 3 Å to approximately 6 Å.

Accordingly, in contrast to conventional staggered and asymmetric quantum wells, the present invention employs a symmetrical approach involving identical materials (InGaN in this example) on both sides of the centrally located lower bandgap (InN in this example) layer. Thus, the present invention involves use of a quantum well active region (InGaN in this example) consisting of very large heterojunction at the active region layer (e.g., InGaN/InN) interfaces, which were formed by the introduction of an ultra thin (delta) layer in the middle of the quantum well layer. The use of such an ultra thin delta layer with a very large heterojunction results in significant enhancement in electron hole wavefunction overlap. Further, such a symmetrical approach leads to strong localization of electron and hole wavefunctions toward the center of the quantum well. Further, such a symmetrical InGaN/InN/InGaN quantum well arrangement, with a thin InN delta layer, advantageously extends the quantum well's emission wavelength into the yellow and red spectral regimes, with a significantly enhanced matrix element and spontaneous emission rate.

BRIEF SUMMARY OF DRAWINGS

The present invention will now be described by way of example with reference to the following drawings in which.

DETAILED DESCRIPTION

The present invention provides a III-Nitride (e.g., GaN-based) semiconductor LED having an enhanced internal quantum efficiency that is achieved by pairing symmetrical low bandgap (e.g., InGaN) layers with a dissimilar (non-InGaN) centrally-located layer of a lower bandgap material in the quantum well's active layer. More specifically, the present invention provides a symmetrical quantum well active layer that includes an inner layer of a relatively low bandgap material, and a pair of outer layers sandwiching the inner layer. The outer layers are relatively thick and are made of a material having a relatively higher bandgap. The inner layer is relatively thin and functions as a delta layer by cooperating with the outer layers to function as a quantum well active layer.

In a preferred embodiment, the active layer includes a central delta layer of InN measuring approximately 6 Å or less bounded by a pair of InGaN outer layers. In such an embodiment, the symmetrical quantum well active layer advantageously extends the quantum well's emission wavelength into the yellow and red spectral regimes, and provides a significantly enhanced spontaneous emission rate, making an associated semiconductor LED particularly suitable for solid state lighting, display and medical applications. In one exemplary embodiment, the outer layers comprise InGaN, and the inner layer comprises InN.

Figure 3:
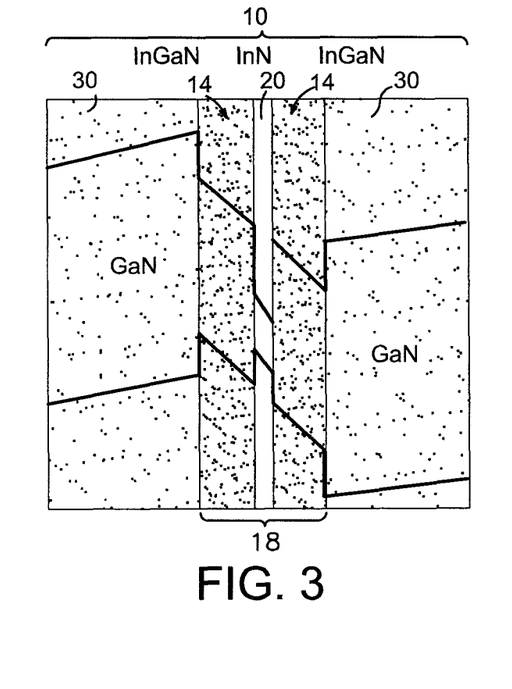
FIG. 3 is a diagrammatic representation of a semiconductor LED's gallium-nitride-based quantum well that includes a thin InN delta layer symmetrically paired with InGaN layers in accordance with an exemplary embodiment of the present invention.

Referring now to FIGS. 3-6B, the present invention provides a new nitride-based active region with high electron-hole wave function overlap by sandwiching a layer of lower bandgap material such as InN, between outer layers of a relatively higher bandgap material suitable for use as an active layer, such as InGaN, (i.e., an InGaN-delta-InN quantum well). By way of alternative example, InGaN with a lower In-content, e.g., in the range of 15-35% may be used as the lower bandgap outer layers and InGaN with a higher In-content, e.g., >70%, may be used as the higher bandgap inner/central layer. FIG. 3 is a diagrammatic representation of an exemplary gallium-nitride-based quantum well 10 that includes an active region 18 including a thin inner layer 20 of indium nitride (InN) symmetrically paired with InGaN outer layers 14. Specifically, the thin inner layer 20 is sandwiched between two adjacent outer layers 14 of an identical material (InGaN), which are in turn sandwiched between the GaN barrier layers 30. The symmetrically arranged outer layers 14 have an identical composition and an essentially identical thickness. Importantly, the inner layer 20 is thin relative to the adjacent quantum well layers, and has a low bandgap characteristic relative to the bandgap characteristic of the adjacent outer quantum well layers. In this exemplary embodiment, the inner layer is constructed of InN and has a thickness of approximately 3 Å-6 Å. Also in this embodiment, and the adjacent quantum well layers are constructed of InGaN layer, each of which has a thickness of approximately 15 Å-30 Å. As will be appreciated by those skilled in the art, InGaN has a relatively high bandgap characteristic ($E_g$=~2.5-3.2 eV), and InN has a relatively low bandgap characteristic ($E_g$=0.69 eV).

The ultra-thin layer (3 Å-6 Å for InN) of a low-bandgap material in the quantum well active region acts as a delta-layer in the quantum well, which in turn leads to significant enhancement of $\Gamma_{e\_hh}$. The delta-layer leads to the strong localization of the electron and hole wavefunctions toward the center of the quantum well. In contrast to the prior approaches to enhance the overlap, the optimized $\Gamma_{e\_hh}$ for the InGaN-delta-InN quantum well increases as its emission wavelength extends to longer spectral regimes in the entire visible spectrum. For illustrative purposes, the optical properties of an InGaN-delta-InN quantum well are compared herein to those of the conventional InGaN quantum well for LED applications.

Figure 4A:
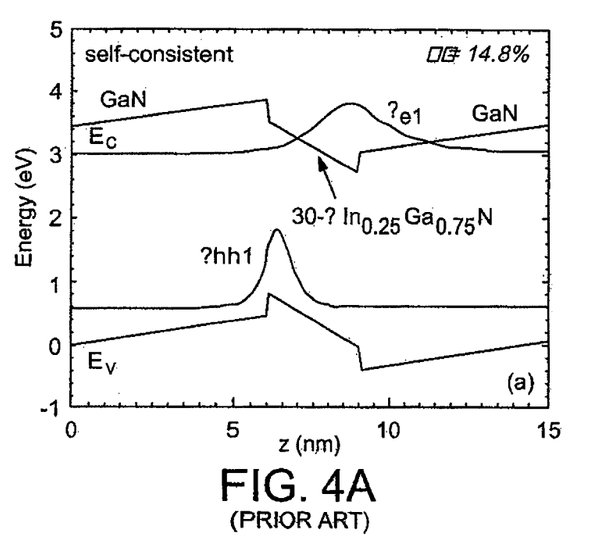
FIG. 4A is a graph showing energy band lineup profiles and wavefunctions of the first conduction subband (C1) and the first valence subband (HH1) at zone center for an exemplary prior art InGaN quantum well.
Figure 4B:
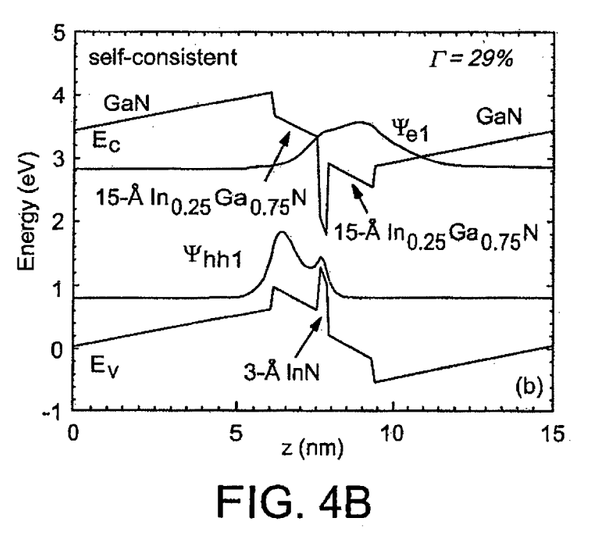
FIG. 4B is a graph showing energy band lineup profiles and wavefunctions of the first conduction subband (C1) and the first valence subband (HH1) at zone center for a similar InGaN quantum well including an InN delta-layer in accordance with the present invention.

FIG. 4A shows a graph of the energy band lineup profiles and the wavefunctions of the first conduction subband (C1) and the first valence subband (HH1) at zone center for an exemplary prior art InGaN quantum well, specifically a 30-Å $In_{0.25}Ga_{0.75}N$ quantum well. In contrast, FIG. 4B shows a similar graph for a similar 30-Å $In_{0.25}Ga_{0.75}N$ quantum well that further includes a 3-Å InN delta-layer consistent with the present invention. As will be noted from FIGS. 4A and 4B, due to the existence of the internal electric field, the charge separation leads to a significant reduction of overlap $\Gamma_{e\_hh}$ of 14.8% for a conventional 30-Å $In_{0.25}Ga_{0.75}N$ quantum well for an emission wavelength of 492 nm as shown in FIG. 4A. In contrast, by including 3-Å InN delta-layer in the center of the 30-Å $In_{0.25}Ga_{0.75}N$ quantum well in accordance with the present invention (as shown in FIG. 3), the large band offset between InGaN and InN leads to the strong localization of electron and hole wavefunctions toward the center of the quantum well active region, resulting in enhanced overlap $\Gamma_{e\_hh}$ of 29%, as best shown in FIG. 4B.

Thus, the inclusion of the InN delta-layer in the InGaN quantum well leads to strong modification of the electron and hole wavefunctions resulting in significant increase in the overlap $\Gamma_{e\_hh}$, as well as accompanied by a strong red-shift of the transition wavelength up to 590 nm. Therefore, the InGaN-delta-InN quantum well is very distinct from a three-layer staggered InGaN quantum well of the prior art, where the latter's overlap $\Gamma_{e\_hh}$ decreases as the emission wavelength extends to the longer spectral regime. In contrast to asymmetric quantum wells, which include different materials on each side of the central InN layer, such as GaN on one side and InGaN on the other side, the present invention employs a symmetrical approach involving identical materials (InGaN in this example) on both sides of the centrally located (InN in this example) layer. Notably, such a symmetrical approach leads to strong localization of electron and hole wavefunctions toward the center of the quantum well.

Figure 5A:
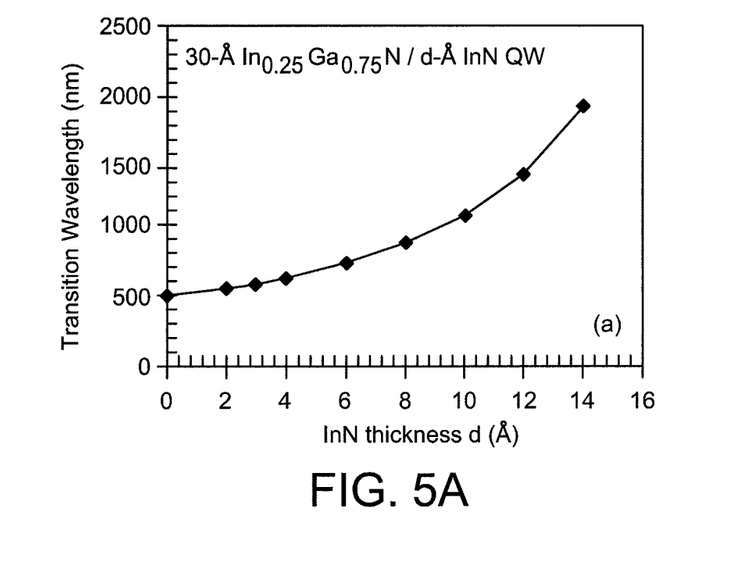
FIG. 5A is a graph showing interband transition wavelength as a function of InN layer thickness for exemplary InGaN quantum wells including a thin InN delta layer.

FIG. 5A is a graph showing the inter-band transition wavelength as a function of the thickness (d-Å) of the InN layer for an exemplary InGaN quantum well, namely, a quantum well including 30-Å $In_{0.25}Ga_{0.75}N$ and delta layers of various thicknesses (d-Å). As will be appreciated from FIG. 5A, the inter-band transition wavelength increases as the thickness of the InN layer increases.

Figure 5B:
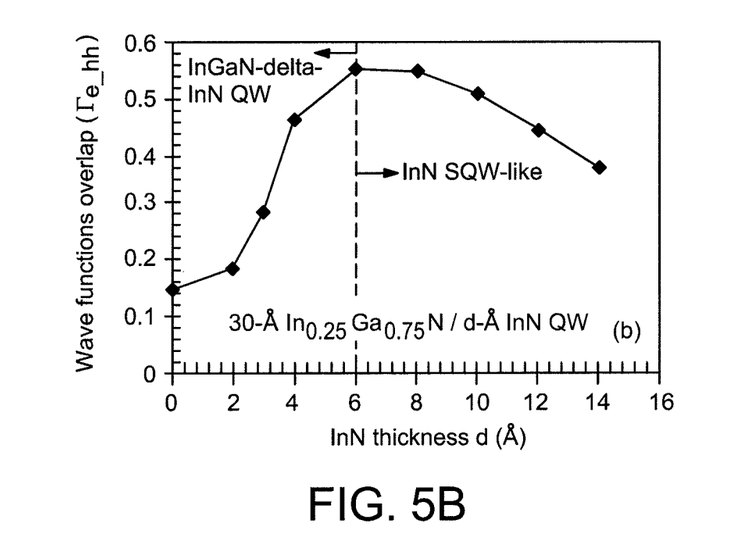
FIG. 5B is a graph showing electron-hole wavefunction overlap as a function of InN layer thickness for exemplary InGaN quantum wells including a thin InN delta layer.

FIG. 5B is a graph showing the overlap ($\Gamma_{e\_hh}$, as a function of the thickness of the inner layer for an exemplary 30-Å $In_{0.25}Ga_{0.75}N$ quantum well structure including an InN delta layer of various thicknesses (d-Å). As shown in FIG. 5B, for embodiments in which the InN layer thickness is ≤6 Å (inner layer acting as a delta layer), the overlap $\Gamma_{e\_hh}$ increases as InN layer thickness increases due to the shift of the electron and hole wavefunctions toward the center of the InGaN quantum well. It is noted, in contrast, that such overlap decreases for a central layer of InN having a thickness >6 Å, in which case the inner layer does not function as a delta layer. Notably, an embodiment including an InGaN quantum well with a thin delta-InN layer (≤6 Å) provides red-shifting of the emission wavelength significantly, accompanied by enhancement in the overlap $\Gamma_{e\_hh}$.

Thus, the role of the InN layer in the InGaN-delta-InN quantum well structure in accordance with the present invention (thin delta InN layer with a thickness less than or equal to 6 Å) is very different from that in the InN single quantum well (SQW) that includes an InN layer having a thickness greater than 6 Å, as best shown in FIG. 5B. More specifically, when the InN layer thickness is greater than 6 Å, the overlap $\Gamma_{e\_hh}$ decreases as InN layer thickness increases, which indicates that the InN layer behaves as SQW.

Figure 6A:
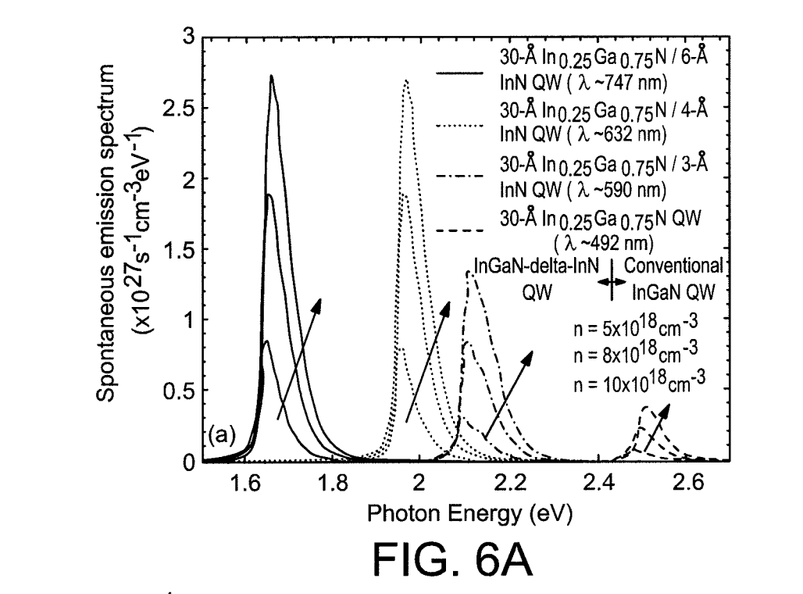
FIG. 6A is a graph of spontaneous emission spectra for an exemplary InGaN quantum wells including a thin InN delta layer in comparison to conventional InGaN quantum well.

FIG. 6A is a graph showing the spontaneous emission spectra for (i) a prior art 30-Å $In_{0.25}Ga_{0.75}N$ quantum well (dashed line), (ii) an exemplary 30-Å $In_{0.25}Ga_{0.75}N$/3-Å InN quantum well consistent with the present invention (dash-dot line), (iii) an exemplary 30-Å $In_{0.25}Ga_{0.75}N$/4-Å InN quantum well consistent with the present invention (dot-dot line), and (iv) a 30-Å $In_{0.25}Ga_{0.75}N$/6-Å InN quantum well consistent with the present invention (solid line) at carrier densities (n) of n=5-10×$10^{18}$ cm$^{-3}$ at T=300K. As will be appreciated from FIG. 6A, in embodiments involving the inclusion of a InN delta-layer, the transition wavelength shows significant red-shift as compared to that of a conventional InGaN quantum well. More specifically, the 30-Å $In_{0.25}Ga_{0.75}N$/3-Å InN quantum well shows a red-shift from 492 nm (conventional InGaN quantum well) to 590 nm with approximately 3.4 times higher of the peak spontaneous emission spectra (1.34×$10^{27}$ s$^{-1}$ cm$^{-3}$ eV$^{-1}$) than that of the conventional one (3.9×$10^{26}$ s$^{-1}$ cm$^{-3}$ eV$^{-1}$) at n=10×$10^{18}$ cm$^3$. The $In_{0.25}Ga_{0.75}N$ quantum well with 4-Å InN delta-layer structure shows a red-shift from 492 nm (conventional InGaN quantum well) to 632 nm with approximately 7 times higher of the peak spontaneous emission spectra (2.7×$10^{27}$ s$^{-1}$ cm$^{-3}$ eV$^{-1}$) than that of the conventional one at n=10×$10^{18}$ cm$^3$. The $In_{0.25}Ga_{0.75}N$ quantum well with 6-Å InN delta-layer shows a red-shift from 492 nm (conventional InGaN quantum well) to 747 nm with approximately 7 times higher of the peak spontaneous emission spectra (2.73×$10^{27}$ s$^{-1}$ cm$^{-3}$ eV$^{-1}$) than that of the conventional one at n=10×$10^{18}$ cm$^{-3}$.

Figure 6B:
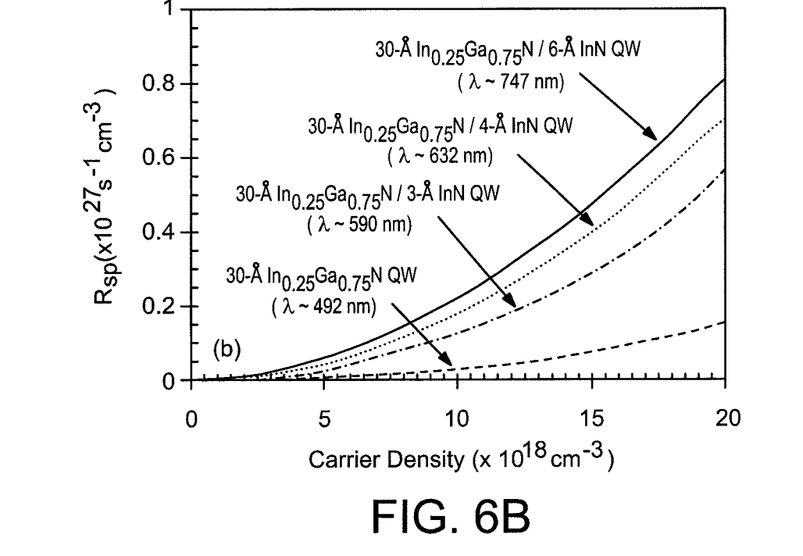
FIG. 6B is a graph of spontaneous emission radiative recombination rate ($R_{sp}$) as a function of carrier density.

FIG. 6B is a graph showing the spontaneous emission radiative recombination rate per unit volume ($R_{sp}$) for (i) a conventional 30-Å $In_{0.25}Ga_{0.75}N$ quantum well, (ii) a 30-Å $In_{0.25}Ga_{0.75}N$/3-Å InN quantum well consistent with the present invention, (iii) a 30-Å $In_{0.25}Ga_{0.75}N$/4-Å InN quantum well consistent with the present invention, and (iv) a 30-Å $In_{0.25}Ga_{0.75}N$/6-Å InN quantum well consistent with the present invention as a function of carrier density up to 2×$10^{19}$ cm$^3$. As will be appreciated from FIG. 6B, for the 30-Å $In_{0.25}Ga_{0.75}N$/3-Å InN quantum well embodiment, the spontaneous emission radiative recombination rate ($R_{sp}$) is enhanced by 4-4.6 times at each carrier density as compared to that for conventional 30-Å $In_{0.25}Ga_{0.75}N$ quantum well. The enhancement of the $R_{sp}$ for a similar quantum wells including 4 Å and 6 Å delta layers as compared to that of the conventional 30-Å $In_{0.25}Ga_{0.75}N$ quantum well is very significant, ranging between 5.2-8.3 and 6.4-12 times, respectively.

Suitable high quality InN alloy may be grown by metalorganic chemical vapor deposition (MOCVD) and molecular beam epitaxy (MBE). The growth of InN material by MBE has resulted in high electron mobility in the order of 2370 cm$^2$/(V·sec), which is attributed to the high quality of the InN alloys grown by MBE. The use of pulsed MOCVD has also resulted in high optical quality droplet-free InN alloy with narrow bandgap properties. MBE has been shown suitable for growing an InN layer with monolayer (~3-Å) precision. Accordingly, conventional techniques may be used to make the novel structures disclosure herein.

Thus, the inclusion of a thin delta layer sandwiched between adjacent layers in a quantum well leads to the red-shift of its emission wavelength, as well as significant increase in the optical matrix element and spontaneous emission rate. Accordingly, inclusion of a narrow-bandgap delta-layer between adjacent layers of higher bandgap material in a quantum well enables the extension of emission wavelength while resulting in a quantum well with a large optical matrix element and a large radiative recombination rate. Embodiments including a delta-InN layer in an InGaN quantum well extend emission wavelength into the yellow and red spectral regimes, with significantly-enhanced optical matrix element and spontaneous emission rate.

A symmetrical quantum well active regions in accordance with the present invention may be formed using conventional manufacturing techniques, e.g., growing by III-V semiconductor MOCVD/MBE epitaxy and molecular beam epitaxy (MBE), through the use of metal organic chemical vapor deposition (MOCVD) growth. Further, the symmetrical quantum well active region may be incorporated into various devices and be used in a conventional manner. By way of example, the inventive symmetrical quantum well active region may be employed in various types of optoelectronic devices including amplifiers, light emitting diodes and edge emitting and surface emitting lasers that incorporate optical feedback to provide lasing action, and may have application in solid state lighting, solid state displays, lasers, light emitting diodes (LEDs), biomedical therapy and diagnostic devices, medical lasers, eye surgery devices and DVD lasers.

In one embodiment, the present invention provides a symmetrical quantum well active region. In another embodiment, the present invention provides a gallium-nitride based semiconductor device including the symmetrical quantum well active region. In yet another embodiment, the present invention provides an optoelectronic device including the gallium-nitride based semiconductor device. In still another embodiment, the present invention provides a semiconductor laser including the symmetrical quantum well active region.

While the present invention has been particularly shown and described with reference to the preferred mode as illustrated in the drawing, it will be understood by one skilled in the art that various changes in detail may be effected therein without departing from the spirit and scope of the invention as defined by the claims.

What is claimed is:

1. A III-nitride based semiconductor device comprising:
    a substrate;
    a first barrier layer comprising a GaN-based material formed over said substrate;
    a second barrier layer comprising a GaN-based material disposed over said first barrier layer; and
    an InGaN-delta-InN quantum well active layer positioned between said first and second barrier layers, said quantum well active layer comprising:
        an inner quantum well delta layer of an InN material, said inner quantum well delta layer having a thickness of approximately 6 Å or less, said first nitride-based material having a first bandgap characteristic; and
        a pair of outer quantum well layers, each of said pair of outer quantum well layers being of an InGaN material having an Indium content in the range of about 15% to 35%, said pair of outer quantum well layers sandwiching said inner quantum well delta layer, each of said pair of outer quantum well layers having a respective thickness greater than said thickness of said inner quantum well delta layer and measuring approximately 15 Å to 30 Å;
    wherein said InGaN-delta-InN quantum well active layer emits light in a wavelength range of about 500 nm to about 750 nm when the semiconductor device is energized.

2. The III-nitride based semiconductor device of claim 1, wherein at least one of said GaN-based materials comprises AlGaN.

3. The III-nitride based semiconductor device of claim 2, wherein an Indium content of said InN material is about 90% to 100%.

4. The III-nitride based semiconductor device of claim 1, wherein said Indium content of said InGaN material is about 25%.

5. The III-nitride based semiconductor device of claim 4, wherein said inner quantum well layer has a thickness measuring approximately 4 Å or less.

6. The III-nitride based semiconductor device of claim 1, wherein said pair of outer quantum well layers are symmetrical in that they have substantially identical thickness.

7. The III-nitride based semiconductor device of claim 1, wherein said pair of outer quantum well layers are symmetrical in that they comprise substantially identical material.

8. The III-nitride based semiconductor device of claim 1, wherein said pair of outer quantum well layers are symmetrical in that they have substantially similar bandgap characteristics.

9. A III-nitride based semiconductor device comprising:
    a substrate;
    a first barrier layer formed over said substrate;
    a first delta-layer-based quantum well active layer formed over said first barrier layer;
    a second barrier layer formed over said first-delta-layer-based quantum well active layer;
    a second delta-layer-based quantum well active layer formed over said second barrier layer; and
    a third barrier layer formed over said second delta-layer-based quantum well active layer;
    wherein each of said first and second delta-layer-based quantum well active layers comprises:
        a pair of outer layers of a first nitride-based material, each of said pair of outer layers having a first thickness, said first nitride-based material having a first bandgap characteristic; and
        a central layer of a second nitride-based material having a bandgap characteristic lower than that of said first nitride-based material, said central layer being positioned between said pair of outer layers, said central layer being thinner than each of said pair of outer layers and having a thickness measuring approximately 6 Å or less;
        a difference between said first and second bandgap characteristics being so large and said central layer being so thin that said central layer and said pair of outer layers cooperate to collectively provide a multi-layer quantum well active layer for trapping carriers between said first and second barrier layers and across both said central layer and said pair of outer layers of said delta-layer-based quantum well active layer during operation of the III-nitride based semiconductor device.

10. The III-nitride based semiconductor device of claim 9, wherein each of said pair of outer layers has a thickness measuring approximately 15 Å to 16 Å.

11. The III-nitride based semiconductor device of claim 9, wherein said central layer comprises InN.

12. The III-nitride based semiconductor device of claim 9, wherein said central layer has a thickness measuring approximately 4 Å or less.

13. A III-Nitride based semiconductor device comprising:
a substrate;
a first barrier layer comprising a nitride-based material formed over said substrate;
a second barrier layer comprising a nitride-based material disposed over said first barrier layer; and
a delta-based quantum well active layer sandwiched between said first and second barrier layers, said delta-based quantum well active layer comprising:
an inner delta layer of a first nitride-based material, said inner delta layer having a first thickness, said first nitride-based material having a first bandgap characteristic; and
a pair of outer layers of a second nitride-based material different from said first nitride-based material, said pair of outer layers sandwiching said inner delta layer, each of said pair of outer layers having a second thickness greater than said first thickness, said second nitride-based material having a second bandgap characteristic greater than said first bandgap characteristic;
wherein said first and second nitride-based materials and said first and second thicknesses are selected to provide a heterojunction sufficiently large that said inner delta layer and said pair of outer layers collectively provide a multi-layer quantum well active layer for trapping carriers between said first and second barrier layers and across both said inner delta layer and said pair of outer layers of said delta-layer-based quantum well active layer, and for emitting light in a wavelength range of about 500 nm to about 750 nm, during operation of the III-nitride based semiconductor device.

14. The III-Nitride based semiconductor device of claim 13, wherein said second nitride-based material comprises InGaN.

15. The III-Nitride based semiconductor device of claim 14, wherein said first nitride-based material comprises InN.

16. The III-Nitride based semiconductor device of claim 13, wherein said first thickness measures approximately 6 Å or less.

17. The III-Nitride based semiconductor device of claim 16, wherein said first thickness of said inner delta layer is approximately 4 Å or less.

18. The III-Nitride based semiconductor device of claim 16, wherein said second thickness of each of said pair of outer layers is approximately 15 Å to 30 Å.

19. The III-Nitride based semiconductor device of claim 13, wherein said first nitride-based material comprises InGaN having In content greater than approximately 70 percent, and wherein said second nitride-based material comprises InGaN having In content lower than approximately 70 percent.

20. The III-Nitride based semiconductor device of claim 19, wherein said second nitride-based material comprises InGaN having In content in a range of approximately 15% to approximately 35%.

21. The III-Nitride based semiconductor device of claim 20, wherein said second thickness of each of said pair of outer layers is approximately 15 Å to 30 Å, and wherein said first thickness of said inner delta layer is in a range from approximately 3 Å to approximately 6 Å.

22. A III-nitride based semiconductor device comprising:
a substrate;
a first barrier layer comprising a GaN-based material formed over said substrate;
a second barrier layer comprising a GaN-based material disposed over said first barrier layer; and
an InGaN-delta-InN quantum well active layer positioned between said first and second barrier layers, said quantum well active layer comprising:
an inner quantum well delta layer of an InN material, said inner quantum well delta layer having a thickness of about 6 Å or less, said first nitride-based material having a first bandgap characteristic; and
a pair of outer quantum well layers, each of said pair of outer quantum well layers being of an InGaN material having an Indium content of about 25%, said pair of outer quantum well layers sandwiching said inner quantum well delta layer, each of said pair of outer quantum well layers having a respective thickness greater than said thickness of said inner quantum well delta layer and measuring about 15 Å to about 30 Å;
wherein said InGaN-delta-InN quantum well active layer emits light in a wavelength range of about 500 nm to about 750 nm when the semiconductor device is energized.

23. The III-nitride based semiconductor device of claim 22, wherein each of said pair of outer quantum well layers are of said InGaN material having said Indium content of 25% and a thickness of 16 Å, and wherein said an inner quantum well delta layer has a thickness of one of 2 Å, 3 Å, 4 Å, and 6 Å.

* * * * *